United States Patent [19]

Speake

[11] Patent Number: 5,028,894
[45] Date of Patent: * Jul. 2, 1991

[54] BANDPASS FILTER CIRCUIT ARRANGEMENT

[75] Inventor: John D. Speake, Cambridge, England

[73] Assignee: U.S. Philips Corp., New York, N.Y.

[ * ] Notice: The portion of the term of this patent subsequent to Jun. 13, 2006 has been disclaimed.

[21] Appl. No.: 275,162

[22] Filed: Nov. 22, 1988

[30] Foreign Application Priority Data

Nov. 27, 1987 [GB] United Kingdom ............... 8727832

[51] Int. Cl.[5] .......................................... H03H 7/12
[52] U.S. Cl. ................................... 333/174; 333/175; 334/15
[58] Field of Search ................. 333/174, 175; 334/15; 455/195

[56] References Cited

U.S. PATENT DOCUMENTS

| | | | |
|---|---|---|---|
| 2,997,672 | 8/1961 | Reinsmith | 333/174 X |
| 3,624,514 | 11/1971 | Putzer | 334/15 X |
| 3,646,449 | 2/1972 | Hellbarth et al. | 334/15 X |
| 3,903,487 | 9/1975 | Maier | 334/15 X |
| 4,316,108 | 2/1982 | Rogers, Jr. | 307/521 |
| 4,586,007 | 4/1986 | Ciszek | 333/174 X |
| 4,839,617 | 6/1989 | Speake | 333/174 |

FOREIGN PATENT DOCUMENTS

| | | | |
|---|---|---|---|
| 2321462 | 11/1974 | Fed. Rep. of Germany | 333/175 |
| 2555847 | 5/1985 | France . | |
| 81340 | 5/1983 | Japan | 455/195 |
| 1417178 | 8/1988 | U.S.S.R. | 333/174 |
| 1295850 | 11/1972 | United Kingdom . | |
| 2172160 | 9/1986 | United Kingdom . | |

Primary Examiner—Eugene R. LaRoche
Assistant Examiner—Benny Lee
Attorney, Agent, or Firm—Jack D. Slobod

[57] ABSTRACT

A bandpass filter circuit arrangement in which a pair of parallel-resonant circuits (1, 2) are reactively intercoupled has a pair of signal input terminals (16, 17) connected to one of the resonant circuits (1) and a pair of output terminals (18, 19) connected to the other resonant circuit (2). Tuning of the filter is accomplished by varying the capacitive component of each circuit by varying the output of a tuning voltage source (20). In order to compensate for the deviation from the optimum intercoupling which would otherwise occur with change of tuning frequency the capacitive component of each resonant circuit is formed by two pairs (5, 7 and 6,8, or 9,11 and 10, 12) of capacitors in series, each series-connected pair effectively forming a varaible capacitive voltage divider to the tap on which the reactive intercoupling means (15) is connected. One capacitor (5, 6, 9 or 10) of each pair is variable, and all these are adjusted at the same rate. The other capacitor (7, 8, 11 or 12) is fixed, and the ratio between the capacitances of the fixed capacitors of each capacitive component are chosen so that the required degree of compensation is obtained. As an alternative the fixed capacitors may be replaced by short circuits and the variable capacitors of each capacitive component may be varied at different rates.

6 Claims, 1 Drawing Sheet

BANDPASS FILTER CIRCUIT ARRANGEMENT

BACKGROUND OF THE INVENTION

1. Related Application

This application is related in subject matter to application Ser. No. 275,044 by the same inventor, bearing the same title; which issued Nov. 22, 1988 as U.S. Pat. No. 4,839,617.

2. Field of the Invention

This invention relates to a bandpass filter circuit arrangement comprising first and second parallel-resonant circuits each of which comprises an inductive component and a capacitive component, each said capacitive component comprising a pair of capacitors in series, corresponding first capacitors of each pair being variable in step with each other, a bidirectional reactive coupling being provided between a point on the connection between the capacitors of one pair and a point on the connection between the capacitors of the other pair.

3. Description of the Prior Art

A filter arrangement of this type is disclosed in patent specification GB-A-1 295 850 (FIG. 4 as modified by FIG. 5 and the corresponding description), to which U.S. Pat. No. 3,624,514 corresponds. In this known filter the bidirectional coupling includes a series capacitor and each variable capacitor is varied in step with variation of tuning capacitors which tune the respective resonant circuits, in order to obtain substantially constant matching of the filter to the output impedance of a transistor which feeds it, over the complete tuning range.

Bandpass R.F. filters are used extensively in radio communication equipment for many purposes such as the rejection of spurious response frequencies in superhet receivers, suppression of unwanted radiation from oscillators, impedance transformation, etc. A typical such filter consists of two or more parallel resonant circuits, with a bidirectional coupling between each resonant circuit and the next. Many types of coupling are possible, and are well documented in the standard reference books. The most commonly used, because of its simplicity and low cost, is so-called "top capacitance coupling" in which one common point of the capacitive component and the inductive component of each resonant circuit is connected to the corresponding point on the next resonant circuit (if present) via a series-capacitor (the other such common points being connected to ground). The value of the (or each) series capacitor is chosen so that the required degree of coupling is obtained; usually this means that the value of each series capacitor has to have a particular relationship to the value of the capacitive component of each of the two resonant circuits which it intercouples, for example to obtain so-called "critical coupling". This means that if a filter which employs simple top capacitance coupling is required to be tunable over a substantial frequency range, for example a frequency range exceeding 10% of a frequency within this range, the tuning has to be done by adjusting the inductive components of the various resonant circuits, e.g. by means of adjustable ferrite cores, because adjustment of the capacitive components would result in an impermissible change of the degree of coupling from the optimum. Thus variable capacitance diodes cannot be used for tuning such filters over a substantial frequency range; if they were, a filter which is optimally coupled in the centre of the tuning frequency range would be substantially overcoupled at the upper end of this range and substantially under-coupled at the lower end.

SUMMARY OF THE INVENTION

It is an object of the invention to enable this disadvantage to be mitigated. To this end a bandpass filter arrangement of the kind specified in the opening paragraph is characterised in that the other capacitors of each pair are also variable in step with each other, means being provided for varying the capacitances of all said capacitors simultaneously.

It has now been recognised that the change of coupling which occurs with a change of tuning frequency achieved by a variation of tuning capacitance can be reduced by connecting the bidirectional reactive coupling provided between the relevant pair of resonant circuits between a tap on the capacitive component of one circuit and a corresponding tap on the capacitive component of the other circuit. If each said capacitive component consisted solely of a pair of capacitors in series, one being fixed and the other being variable and with the junction of these capacitors constituting the corresponding tap, then although the effective change of position of each tap on the capacitive divider formed by the corresponding pair of capacitors produced by variation of the corresponding variable capacitor can be made to change the coupling between the two resonant circuits in the correct direction to obtain compensation for the change in coupling in which would otherwise occur with a change in tuning frequency, in many circumstances it would be very difficult to obtain the correct amount of compensation, at least without other problems being created. Obviously the value of each fixed capacitor determines the amount of compensation obtained, but the range within which this value must lie is often limited by other considerations. For example, if this value is small, insufficient tuning range may be obtainable by means of the corresponding variable capacitance. Conversely, if this value is large, any signal processed by the filter will occur across the corresponding variable capacitor with a comparatively large amplitude, resulting in the creation of a comparatively large amount of distortion in the signal if the variable capacitor is a non-linear device such as a variable capacitance diode. Therefore according to the invention, the other capacitors of each pair are arranged to be also variable in step with each other and means are provided for varying the capacitances of all the variable capacitors simultaneously. This expedient enables the required degree of compensation to be obtained without creating the problems mentioned above. The capacitances of the first capacitors of each pair can, for example, be varied differently, for example at a lesser rate, to the variation of the capacitances of the other capacitors of each pair, thereby effectively adjusting in any desired manner the positions of the taps on the capacitive voltage dividers formed by the capacitors of each pair (to which taps the bidirectional reactive coupling is connected) for each value of the overall capacitive component of each resonant circuit, i.e. for each value of tuning frequency. However, if each variable capacitor comprises a variable capacitance diode it will often be more convenient if the capacitances of all these diodes are varied at the same rate, thereby enabling them all to be reverse-biassed by means of a common variable d.c. voltage source. This can be achieved, while still effectively adjusting the positions of the aforesaid taps on their respective potential dividers in the desired manner for each value of the overall capacitance component of each resonant circuit, if each capacitive component is arranged to include a respective fixed further capacitor in series with the signal path through the first capacitor of the corresponding pair of variable capacitors to/from the point on that capacitive component to which the bidirectional reactive coupling is connected. The inclusion of these fixed capacitors has, so far as the change of the effective positions of the taps on the corresponding capacitive dividers with change in tuning frequency is concerned, the same effect as would be obtained if the capacitances of the first variable capacitors of each pair were varied at a lesser rate than the capacitances of the other capacitors of each pair, this effect being larger the smaller the capacitances of the fixed capacitors are. In order to provide maximum latitude of choice in the value of the fixed part of each capacitive component perferably each capacitive component also includes a second respective fixed further capacitor in series with the signal path through the other capacitor of the corresponding pair of variable capacitors to/from the point of that capacitive component to which the bidirectional reactive coupling is connected, the second capacitor having a different capacitance to capacitive component.

Embodiments of the invention will be described, by way of example, with reference to the accompanying diagrammatic drawing in which:

BRIEF DESCRIPTION OF THE DRAWING

In FIG. 1 a bandpass filter circuit arrangement comprises first and second parallel-resonant circuits 1 and 2, each of which comprises an inductive component and a capacitive component. The inductive components of these circuits are in the form of coils 3 and 4 respectively. The capacitive component of circuit 1 comprises a pair of series-capacitors 5 and 6 having two further capacitors 7 and 8 connected in series with it, the series combination of capacitors 5, 6, 7 and 8 being connected in parallel with coil 3. Similarly, the capacitive component of resonant circuit 2 comprises a pair of series-capacitors 9 and 10 having two further capacitors 11 and 12 connected in series with it, the series combination of the capacitors 9, 10, 11 and 12 being connected in parallel with the coil 4. Trimming capacitors 13 and 14 are also connected in parallel with the coils 3 and 4 respectively. The junction point of coil 3 and capacitor 6 is connected to ground, as is the junction point of coil 4 and capacitor 10. A bidirectional reactive coupling implemented as a series-capacitor 15 is provided between a point on the connection between capacitors 5 and 6, in fact the junction point of capacitors 7 and 8, and a point on the connection between capacitors 9 and 10, in fact the junction point of capacitors 11 and 12. Input terminals 16 and 17 are connected to a tap on coil 3 and to ground, respectively, and output terminals 18 and 19 are connected to a tap on coil 4 and to ground, respectively.

Figure 1:
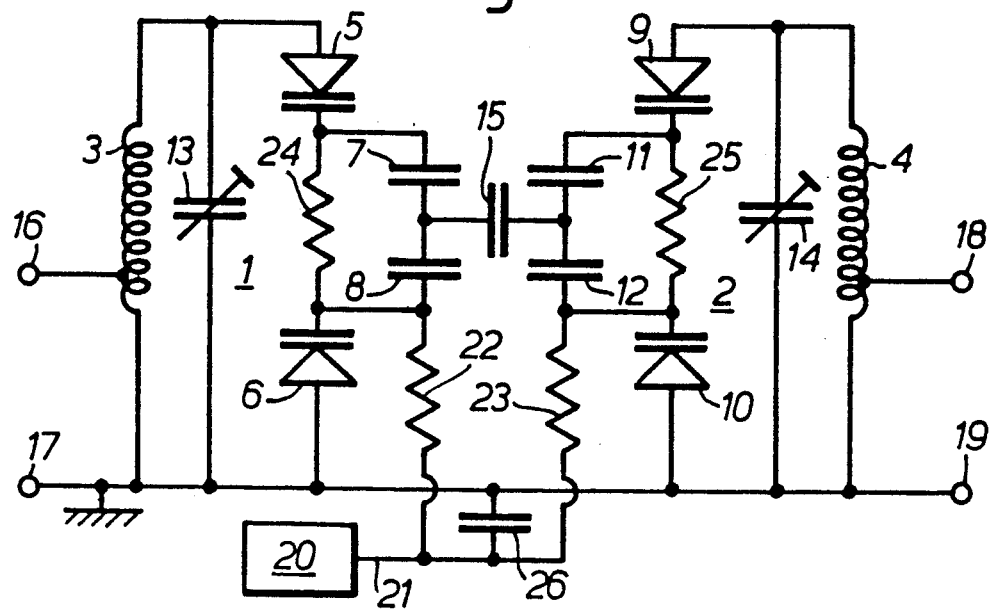
FIG. 1 is the circuit diagram of a first embodiment.

Whereas capacitors 7, 8, 11 and 12 are fixed, capacitors 5, 6, 9 and 10 are variable and are in the form of variable capacitance diodes. In order to vary the capacitances of these diodes in step with each other and hence to tune the filter, a variable reverse-bias d.c. voltage, relative to ground, is applied to them from a variable d.c. tuning voltage source 20, for example from the slider of a potentiometer connected across a direct voltage source. To this end the output 21 of source 20 is connected to the cathodes of the diodes 6 and 10 via high-value series resistors 22 and 23 respectively, these cathodes being connected in turn to the cathodes of the diodes 5 and 9 respectively via high-value series resistors 24 and 25 respectively. Output 21 is also decoupled to ground via a capacitor 26.

Assuming that diodes 5, 6, 9 and 10 have identical characteristics then, if capacitors 7, 8, 11 and 12 were replaced by short-circuits or if capacitors 7 and 8 had the same value and capacitors 11 and 12 had the same value, and if capacitor 15 were chosen to give the desired degree of intercoupling between the resonant circuits 1 and 2 in centre of the tuning range, it would be found that the intercoupling would be greater than that desired at the high-frequency of the tuning range and less than that desired at the low-frequency end of the tuning range, due to the change of the impedance of capacitor 15 with frequency. In fact the rat capacitance of capacitor 7 to that of capacitor 8, and the capacitance of capacitor 11 to that of capacitor 12, are both equal to r, where r is greater than unity. The result of this is that a given change in the capacitances of capacitors 5 and 9 has a greater effect on the degree of coupling provided by the capacitive voltage dividers formed by capacitors 5, 7, 8 and 6, and 9, 11, 12 and 10, between capacitor 15 and the respective resonant circuits 1 and 2, then the same change in the capacitances of capacitors 6 and 10. Thus if, for example, the capacitances of diodes 5, 6, 10 are reduced by increasing the output of source 20 to thereby tune the filter to a higher frequency the coupling provided by the dividers 5, 7, 8, 6 and 9, 11, 12, 10 between capacitor 15 and the respective resonant circuits 1 and 2 effectively reduced, thereby reducing the amount if intercoupling between the resonant circuits 1 and 2 would otherwise occur. The converse effect occurs if the capacitances of diodes 5, 6, 9 and 10 are increased to tune the to a lower frequency. If the ratio r is suitably chosen this change in coupling between the capacitor 15 and resonant circuits 1 and 2 can be made to substantially exactly compensate for the change in the coupling between resonant circuits 1 and 2 which would otherwise occur over the tuning range due to the change with frequency of the of capacitor 15. Obviously the positions of the capacitors 5 and 7, and/or 6 and 8, and/or 9 and 11, and/or 10 and 12 may be interchanged, provided that the reverse-biasing circuit for the diodes 5, 6, 9 and 10 is modified appropriately.

Obviously if capacitor 15 were replaced by an inductor the ratio r would normally have to be chosen less than unity to obtain compensation for the increase in the reactance of the inductance with increasing frequency.

In some circumstances it may be found that the value of the ratio r required is such that either the capacitors 7 and 11 or the capacitors 8 and 12 can be replaced by a direct connection.

In a practical filter constructed as shown in FIG. 1 the inductance of the part of each coil 3 and 4 which lies above its tap was 44 nH and the inductance of the part of each coil 3 and 4 which lies below its tap was 5 nH. The values of the capacitors 7, 11, 8, 12 and 15 were 56 pF, 56 pF, 26.5 pF, 26.5 pF and 2.0 pF respectively. Each variable capacitance diode 5, 6, 9 and 10 consisted in fact of two such diodes, available under the type number BB809, connected in parallel. The centre-frequency of the filter was tunable over a range of approximately 135 MHz to 163 MHz by varying the voltage output of the source 20 over the range +2V to +20V relative to ground. A substantially optimum Butterworth response was obtained over the whole of this tuning range.

It should be noted that the inevitably non-ideal behaviour of various components of the filter with changing frequency may also be taken into account when choosing the ratio r, in order to obtain at least some compensation for this behaviour, if desired.

Figure 2:
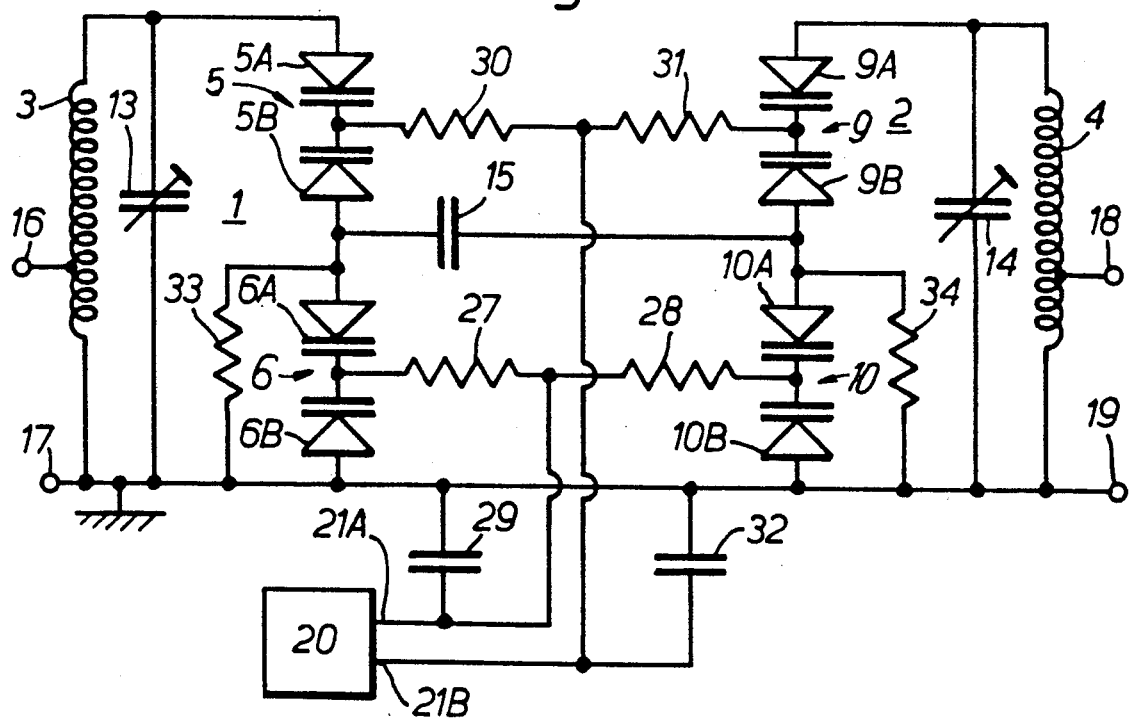
FIG. 2 is the circuit diagram of a second embodiment.

FIG. 2, in which components which have counterparts in FIG. 1 have been given the same reference numerals, is the circuit diagram of a second embodiment of the invention. In FIG. 2, a bandpass filter circuit arrangement again comprises first and second parallel-resonant circuits 1 and 2. However, the capacitive component of each of these resonant circuits is now arranged somewhat differently. Each such component again comprises a pair of variable capacitors, 5, 6, and 9, 10 respectively, connected in series, where these capacitors are now each in the form of a pair of back-to-back-connected variable capacitance diodes suffixed A and B respectively. Capacitors 5 and 6 are now connected directly to each other, as are the capacitors 9 and 10, and capacitor 15 is connected between the common point of the capacitors 5 and 6 and the common point of the capacitors 9 and 10. Variable d.c. tuning voltage source 20 is now provided with two outputs, 21A and 21B respectively. Output 21A is connected to the cathodes of the diodes 6A and 6B via a high-value resistor 27, to the cathodes of the diodes 10A and 10B via a high-value resistor 28, and to ground via a decoupling capacitor 29. Similarly, output 21B is connected to the cathodes of the diodes 5A and 5B via a high-value resistor 30, to the cathodes of the diodes 9A and 9B via a high-value resistor 31, and to ground via a decoupling capacitor 32. The anodes of the diodes 5B and 6A are connected to ground via a high-value resistor 33 and the anodes of the diodes 9B and 10A are connected to ground via a high-value resistor 34.

Variable d.c. tuning voltage source 20 in FIG. 2 may take the form of a suitably programmed microcomputer having first and second output ports which are coupled to the outputs 21A and 21B respectively via respective digital-to-analog converters (not shown). In response to actuation of a tuning adjustment member (not shown) coupled to an input thereof, this microcomputer is programmed to present a succession of digital words to its first and second ports, resulting in the generation of a succession of analog voltages at the outputs 21A and 21B, and hence in the tuning of the filter to a succession of frequencies. The digital words are chosen so that, for each tuning voltage appearing at output 21A, the corresponding tuning voltage appearing at output 21B is such that the voltage division ratios of the capacitive dividers 5, 6 and 9, 10 are such that the required intercoupling occurs between the resonant circuits 1 and 2. Obviously the values of the digital words will be chosen in accordance with the results desired in the particular application. In general if, for example, a critical coupling condition is required to be maintained at each tuning frequency then the digital words will have to be chosen in such a way that, for a given change in the tuning voltage produced at output 21A, a greater change in the same direction occurs in the tuning voltage produced at output 21B. Another possible construction for source 20 is a pair of so-called "look-up tables" having commoned address inputs, the output of each look-up table being coupled to a respective output 21A or 21B via a respective digital-to-analog converter.

It will be evident that many modifications are possible to the arrangements described within the scope of the invention as defined by the claims. For example the capacitors 15 may each be replaced by a pair of capacitors in series, with the junction of the capacitors of the pair connected to ground via a further capacitor. As another example each capacitor 15 may be replaced by an inductor, so that each bidirectional coupling between the resonant circuits 1 and 2 has an inductive rather than a capacitive reactance. However the use of capacitive rather than inductive reactances will usually be preferred, inter alia for reasons of cost.

Although the filters described have each consisted of two sections, it will be evident that the invention may be employed in filters having more than two sections. For example, the circuit shown in FIG. 1 may be extended by connecting a duplicate of capacitor 15 between the junction of capacitors 11 and 12 and the corresponding junction in a duplicate of resonator 2, the variable capacitance diodes in this duplicate being fed from source 20 via a further resistor corresponding to resistor 23.

From reading the present disclosure, other modifications will be apparent to persons skilled in the art. Such modifications may involve other features which are already known in the design, manufacture and use of filters and component parts thereof and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

I claim:

1. A bandpass filter arrangement comprising first and second parallel resonant circuits each of which comprises an inductive component in parallel with a capacitive component, each of said capacitive components comprising variable first and second capacitors connected in a series signal path including a connection means between said first and second capacitors, a bidirectional reactive coupling connected between a point in the series signal path and on the connection means of one of said first and second parallel resonant circuits and a point in the series signal path and on the connection means of the other of said first and second parallel-resonant circuits, and means coupled to all said variable capacitors for simultaneously varying the capacitances of said first capacitors while simultaneously varying the capacitances of the second capacitors, said first and second capacitors being varied in capacitance at respective rates for the purpose of tuning said filter.

2. An arrangement as claimed in claim 1, wherein the rate of varying the capacitances of said second capacitors is different from the rate of varying the capacitances of said first capacitors.

3. An arrangement as claimed in claim 1, wherein each said connection means of each said capacitive component includes a fixed third capacitor connected in the series signal path between the first capacitor and said point, and wherein the rate of varying the capacitances of said second capacitors is substantially the same as the rate of varying the capacitances of the first capacitors.

4. An arrangement as claimed in claim 3, wherein each said connection means of each capacitive component includes a fixed fourth capacitor connected in the series signal path between said second capacitor and said point, said fourth capacitor having a different capacitance from said third capacitor included in said connection means.

5. An arrangement as claimed in claim 4, wherein each variable capacitor comprises a variable capacitance diode and wherein said varying means comprises a variable d.c. voltage source having an output which is d.c.-connected to each of said variable capacitance diodes.

6. An arrangement as claimed in claim 3, wherein each variable capacitor comprises a variable capacitance diode and wherein said varying means comprises a variable d.c. voltage source having an output which is d.c.-connected to each of said variable capacitance diodes.

* * * * *